United States Patent
Suzuki et al.

(10) Patent No.: US 6,329,643 B1
(45) Date of Patent: Dec. 11, 2001

(54) METHOD OF TEMPERATURE-CALIBRATING HEAT TREATING APPARATUS

(75) Inventors: Fujio Suzuki, Tsukui-gun; Koichi Sakamoto; Wenling Wang, both of Sagamihara; Moyuru Yasuhara, Tokyo, all of (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/653,460

(22) Filed: Aug. 31, 2000

(30) Foreign Application Priority Data

Sep. 2, 1999 (JP) .................................................. 11-248912

(51) Int. Cl.$^7$ ................................ H05B 1/02; F27D 3/12
(52) U.S. Cl. ........................................... 219/497; 432/241
(58) Field of Search ..................................... 219/480, 483, 219/490, 491, 494, 497, 502, 508, 509, 510, 444.1; 432/9, 11, 6, 152, 241; 118/724, 725, 728, 729, 730

(56) References Cited

U.S. PATENT DOCUMENTS

| | | | |
|---|---|---|---|
| 5,001,327 | * 3/1991 | Hirashiwa et al. | 219/390 |
| 5,258,601 | * 11/1993 | Takano | 219/486 |
| 5,273,424 | * 12/1993 | Kobayashi | 432/241 |
| 5,387,557 | * 2/1995 | Takagi | 438/758 |
| 5,500,388 | * 3/1996 | Niino et al. | 438/482 |
| 5,616,264 | 4/1997 | Nishi et al. | |
| 5,813,851 | * 9/1998 | Nakao | 432/6 |
| 5,875,416 | * 2/1999 | Kanno | 702/130 |
| 6,095,806 | * 8/2000 | Suzuki et al. | 432/241 |
| 6,222,164 | * 4/2001 | Stoddard et al. | 219/497 |

FOREIGN PATENT DOCUMENTS 3-145121   6/1991   (JP) .
5-267200   10/1993   (JP) .

* cited by examiner

Primary Examiner—Sang Paik
(74) Attorney, Agent, or Firm—Oblon, Spivak, McClelland, Maier & Neustadt, P.C.

(57) ABSTRACT

A second vertical heat treating apparatus is temperature-calibrated based on a heat treatment result obtained by a first vertical heat treating apparatus for reference. First, temperature measurement wafers is heated in the first apparatus to obtain set values of temperature controllers for a target value of temperature. Then, wafers are subjected to an oxidizing process in the first apparatus by using these set values to form an oxide film. The thickness of the oxide film is measured and recorded as a reference film thickness. Then, wafers are subjected to an oxidizing process in a second apparatus at temperatures near the target value to form an oxide film. The thickness of the oxide film is measured, and difference in thickness between the oxide film formed in the second apparatus and the reference film thickness is obtained. The oxidizing process in the second apparatus is repeated to obtain set values of temperature controllers for the second apparatus at the time when the difference in film thickness becomes zero. The second apparatus is temperature-calibrated on the basis of the set value thus obtained.

20 Claims, 6 Drawing Sheets

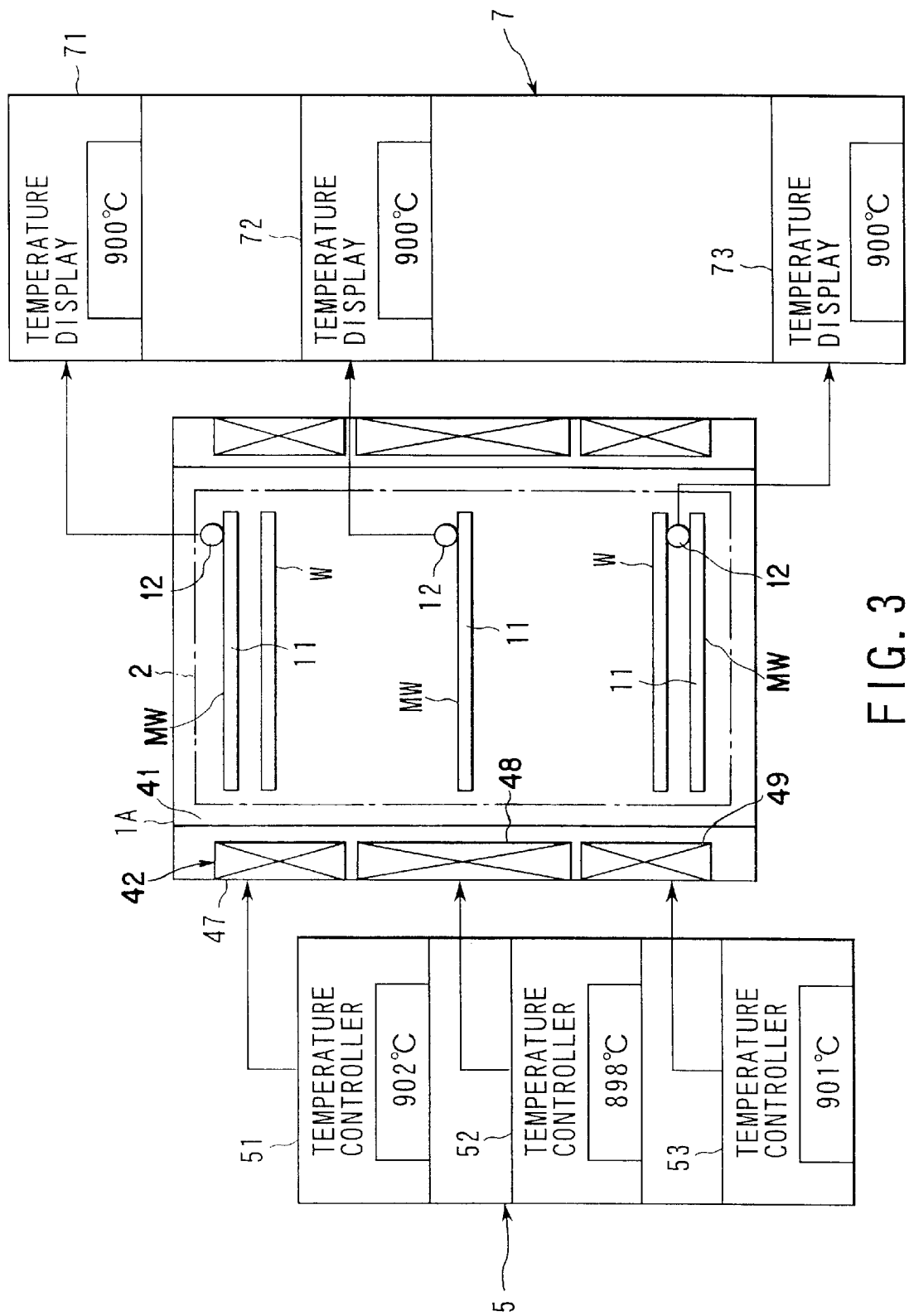
F I G. 3

METHOD OF TEMPERATURE-CALIBRATING HEAT TREATING APPARATUS

CROSS-REFERENCE TO RELATED APPLICATIONS

This application is based upon and claims the benefit of priority from the prior Japanese Patent Application No. 11-248912, filed Sep. 2, 1999, the entire contents of which are incorporated herein by reference.

BACKGROUND OF THE INVENTION

The present invention relates to a method of temperature-calibrating a second heat treating apparatus based on a heat treatment result obtained by a first heat treating apparatus for reference in a semiconductor process. The term "semiconductor process" used herein includes various kinds of processes which are performed to manufacture a semiconductor device or a structure having wiring layers, electrodes, and the like to be connected to a semiconductor device, on a target substrate, such as a semiconductor wafer or an LCD (Liquid Crystal Display) substrate, by forming semiconductor layers, insulating layers, and conductive layers in predetermined patterns on the target substrate.

In the semiconductor process, a vertical heat treating apparatus is known as a batch type process apparatus that permits applying heat treatments such as a film forming process, an oxidizing process and a diffusion process to a number of semiconductor wafers at a time. The vertical heat treatment apparatus is used such that a number of wafers are arrayed and held with a gap therebetween in a vertical direction in a holder called a wafer boat, and then the holder is loaded into a vertical heat treating chamber and a heat treatment such as an oxidizing process is performed.

For subjecting a wafer to a heat treatment, it is necessary to control accurately the wafer temperature. For example, where an oxide film is formed on a wafer by an oxidizing process, the temperature of the wafer influences the thickness of the formed oxide film. Therefore, it is necessary to calibrate the temperature controller of the heater with a high accuracy.

Conventionally, a wafer equipped with a thermocouple is placed in a process chamber of a heat treating apparatus, in which the temperature is to be calibrated, so as to measure the wafer temperature and to perform the calibration on the basis of the measured value and the value indicated by a temperature controller. In a vertical heat treating apparatus disclosed in, for example, Jpn. Pat. Appln. KOKAI Publication No. 3-145121, the temperature control of the heat treating apparatus is performed on the basis of the relationship among the temperature of a wafer equipped with a thermocouple, the temperature within a process chamber, and the temperature of a heater. However, if the wafer equipped with the thermocouple is put in the heat treating chamber, the metals forming the thermocouple are scattered within the heat treating chamber so as to be attached to the heat treating chamber. The attached metals tend to be attached to a wafer to be processed (target wafer) so as to bring about contamination with the metals.

On the other hand, it is being studied to use in place of the thermocouple a radiation type thermometer, in which a radiant light radiated from a wafer is caught and is converted into an electric signal by a photoelectric element so as to measure the temperature of the wafer. In this case, the radiant light coming from portions other than the wafer is also incident on the light receiving section, thereby making it difficult to correct the thermal emissivity.

BRIEF SUMMARY OF THE INVENTION

An object or the present invention is to provide a method that makes it possible to temperature-calibrate a heat treating apparatus with a high accuracy with little possibility of contamination of a target object.

According to the present invention, there is provided a method of temperature-calibrating a second heat treating apparatus based on a heat treatment result obtained by a first heat treating apparatus for reference, the first heat treating apparatus comprising a first process chamber, a first heating unit for heating an inside of the first process chamber, and a first controller for setting a temperature of the first heating unit, the second heat treating apparatus comprising a second process chamber, a second heating unit for heating an inside of the second process chamber, and a second controller for setting a temperature of the second heating unit, the first and second process chambers being substantially equal to each other in construction and the first and second heating units being substantially equal to each other in construction, the method comprising:

a temperature measuring step of heating a measurement substrate for measuring temperature at a selected position within the first process chamber by the first heating unit, and obtaining a first set value of temperature of the first controller for converging a measured temperature of the measurement substrate to a target value of temperature;

a heat treating step on a primary side of forming a first thin film on a first substrate by heating the first substrate at the selected position within the first process chamber by the first heating unit while setting the first controller at the first set value of temperature, the first thin film being formed under a selected process pressure and selected process gas conditions that are selected such that a growth rate of the first thin film is changed as a function of temperature;

a heat treating step on a secondary side of forming a second thin film equal in material to the first thin film on a second substrate substantially equal in size and material to the first substrate under the selected process pressure and selected process gas conditions by heating the second substrate at a position, corresponding to the selected position, within the second process chamber by the second heating unit; and a calibrating step of obtaining a second set value of temperature of the second controller at the time when a thickness of the first thin film and a thickness of the second thin film are made equal to each other, and temperature-calibrating the second heat treating apparatus based on an assumption that the target value of temperature is obtained at the position, corresponding to the selected position, within the second process chamber at a time when a set temperature of the second controller is the second set value of temperature.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently

FIG. 3 is an explanatory view schematically showing the relationship between actually measured temperatures of wafers and set values of temperature of temperature controllers;

DETAILED DESCRIPTION OF THE INVENTION

Figure 1:
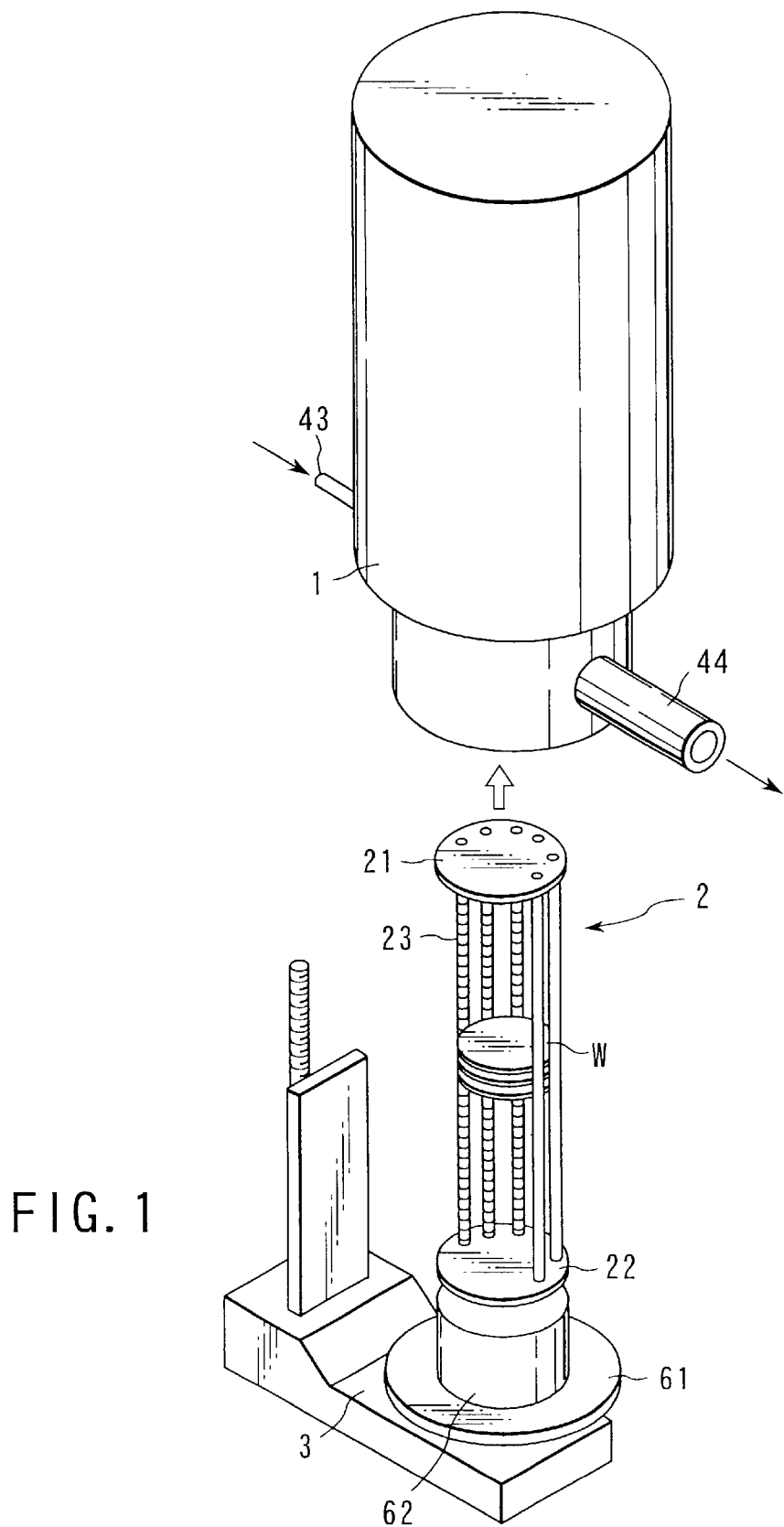
FIG. 1 is a perspective view showing a vertical heat treating apparatus according to an embodiment of the present invention.
Figure 2:
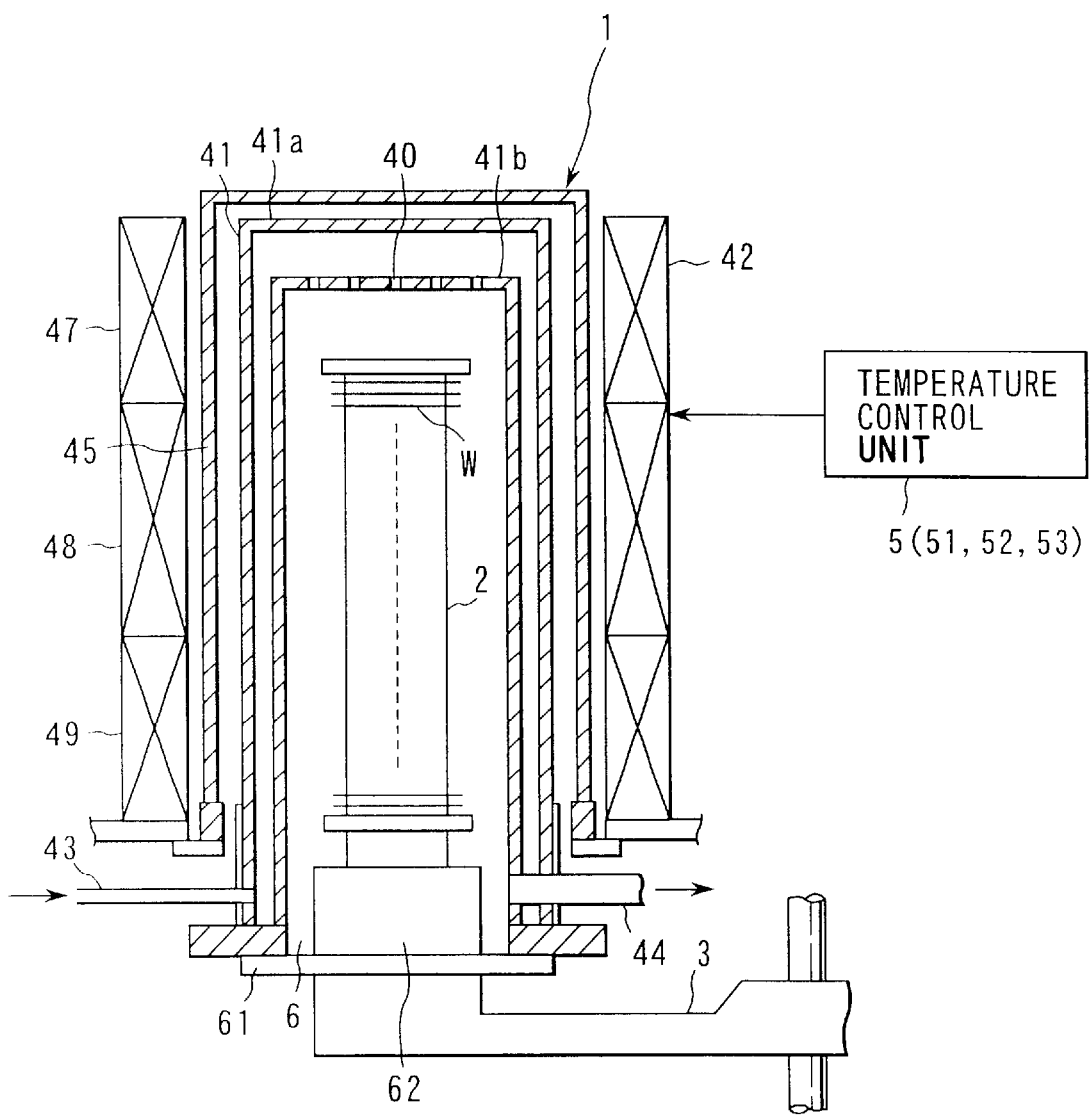
FIG. 2 is a cross sectional view showing the vertical heat treating apparatus shown in FIG. 1.

In the temperature calibrating method according to an embodiment of the present invention, a first vertical heat treatment apparatus for reference and a second vertical heat treatment apparatus that is to be temperature-calibrated are referred to. These first and second heat treating apparatuses are apparatuses of the same design. In other words, the corresponding portions of these two vertical heat treating apparatuses have the same construction. FIGS. 1 and 2 are a perspective view and a cross sectional view, respectively, of the vertical heat treating apparatus of the particular design.

As shown in FIGS. 1 and 2, the apparatus comprises a vertical heat treating furnace 1 including an airtight reaction tube, i.e., a process chamber 41, and a heating unit 42 surrounding the process chamber 41. The process chamber 41 is of a double tube structure consisting of an outer tube 41a and an inner tube 41b each made of, for example, quartz. A plurality of holes 40 are formed at the top portion of the inner tube 41b to permit the outer tube 41a to communicate with the inner tube 41b via the holes 40. A gas supply pipe 43 is connected to a portion in the vicinity of the bottom portion of the outer tube 41a. Also, an exhaust pipe 44 is connected to a portion in the vicinity of the bottom portion of the inner tube 41b.

The process chamber 41 is covered with a temperature-equalizing vessel 45, and the outer surface of the temperature-equalizing vessel 45 is surrounded by the heating unit 42 controlled by a temperature control unit 5. The heating unit 42 consists of a plurality of heaters, e.g., an upper heater 47, a middle heater 48 and a lower heater 48, arranged to heat respective horizontal zones inside the process chamber 41, which differ from each other in height level. The heaters 47, 48 and 49 each consisting of, for example, a heating resistor are connected to temperature controllers 51, 52, and 53, respectively, of the temperature control unit 5. The power to be supplied to the heaters 47 to 49 are controlled by the temperature controllers 51 to 53, respectively, with the result that the heat generation amounts of these heaters are controlled independently of each other. To be more specific, the temperature controllers 51, 52 and 53 are arranged to control the temperatures of an upper group, a middle group and a lower group, respectively, of a number of semiconductor wafers W held by a wafer boat 2, i.e., a holder.

The wafer boat 2 holding target semiconductor wafers W to be processed are moved in a vertical direction so as to load/unload the wafers W into/out of the process chamber 41. The wafer boat 2 comprises, for example, a ceiling plate 21, a bottom plate 22 and a plurality of struts 23 joining the ceiling plate 21 and the bottom plate 22. A large number of grooves are formed in the strut 23 and apart from each other in a vertical direction so as to define horizontal support levels of the wafers W. The peripheries of the wafers are inserted into these grooves, with the result that a number of wafers are arrayed and held with a gap therebetween in a vertical direction.

The wafer boat 2 is disposed on an insulating cylinder 62 arranged on a lid body 61 for opening and closing an opening 6 at the lower end of the process chamber 41. The lid body 61 is mounted to a boat elevator 3, and moved in a vertical direction by the boat elevator 3, so that the wafer boat 2 is loaded/unloaded into/out of the process chamber 41.

The temperature calibration method in the embodiment of the present invention will now be described. In the following description, the first vertical heat treating apparatus for reference and the second vertical heat treating apparatus to be temperature-calibrated are referred to as reference apparatus 1A and installed apparatus 1B, respectively. These apparatuses 1A and 1B are equal to each other in construction as described previously and are constructed as shown in FIGS. 1 and 2.

[Temperature Measuring Step]

The reference apparatus 1A owned by, for example, a manufacturer of heat treating apparatuses is used as the first vertical heat treating apparatus for reference. As shown in FIG. 3, a wafer boat 2 supporting a temperature measurement wafer MW is loaded into the process chamber 41 of the reference apparatus 1A. It is possible to mount the ordinary wafers W, i.e., wafers equal in size and material to the semiconductor wafer that is to be subjected to a heat treatment in the apparatuses 1A and 1B, to the wafer boat 2 together with the temperature measurement wafer MW. The ordinary wafers are supported at a desired support level or supported to fill completely all the support levels, if necessary. The temperature measurement wafers MW are arranged such that at least one temperature measurement wafer MW is placed in each of the zones of different height levels within the process chamber 41, heated by the heaters 47 to 49, respectively.

The temperature measurement wafer MW includes a substrate 11 equal in size and material to an ordinary wafer W, i.e., a semiconductor wafer for products that is to be processed in the vertical heat treating apparatus 1 shown in FIGS. 1 and 2, and a temperature measuring element 12 such as a thermocouple arranged on the substrate 11. If a radiation type thermometer is used, the ordinary wafer can be used as the temperature measurement wafer MW. The details of the temperature measuring method using a temperature measurement wafer equipped with a thermocouple are disclosed in U.S. Pat. No. 5,616,264, the teachings of which are hereby incorporated by reference.

Then, a suitable target value of the heating temperature within the process chamber 41 is set, and the heating of the temperature measurement wafer MW, etc. is started while causing the temperature control unit 5 to control the heat generation amount of the heating unit 42. In this step, the temperature measured via the temperature measurement wafers MW is indicated in a temperature display apparatus 7. For this purpose, the signal line of the temperature measuring element 12 extends through the bottom portion of the wafer boat 2 to the outside of the process chamber 41 via the lid body 61 so as to be connected to the temperature display apparatus 7, though this arrangement is not shown in FIG. 3. Then, a set value of temperature of the temperature control unit 5 for converging the measured temperature to the target value of temperature is obtained by observing the measured temperature.

FIG. 3 schematically shows this situation. Specifically, the temperature measuring wafers MW are held within the heating zones or heating parts of the heaters 47 to 49, and the measured temperatures supplied from the temperature measuring elements 12 are displayed in displays 71, 72, 73 of the temperature display apparatus 7, respectively. The heat generation amounts of the heaters 47 to 49 are controlled by the temperature controllers 51 to 53, respectively. In other words, the temperatures of the temperature measurement wafers MW within the corresponding heating zones are controlled by the temperature controllers 51 to 53.

For example, if the target value of temperature is 900° C., the set values of temperature of the temperature controllers 51 to 53 are adjusted such that the respective temperatures displayed on the temperature displays 71 to 73 become 900° C. In FIG. 3, when the set values of temperature of the temperature controllers 51 to 53 are 902° C., 898° C. and 901° C., respectively, these specific temperature values being for the sake of convenience in explanation, the temperature of the temperature measurement wafer MW in each heating zone becomes 900° C. In this manner, the set values of temperature for the temperature controllers 51 to 53, the time when the wafers MW are heated to the target value of temperature (900° C. in this example), are obtained for the heating zones and recorded as set values of temperature on the primary side.

Further, if necessary, a plurality of target values of temperature other than 900° C. are set, so as to carry out the temperature measuring step for each of these plural target values of temperature. As a result, it is possible to obtain the set values of temperature of the temperature controllers 51 to 53 with respect to the target values of temperature other than 900° C. [Heat Treating Step on Primary Side]

In the next step, the wafer boat 2 supporting the ordinary wafers W for the heat treatment in the same manner as in the temperature measuring step is loaded into the process chamber 41 of the reference apparatus 1A. Then, an oxidizing process is carried out by setting the temperature controllers 51 to 53 at the set values of temperature on the primary side for 900° C. so as to form an oxide thin film on each wafer W. As described above, the ordinary wafers W are mounted to the wafer boat 2 in the same manner as in the temperature measuring step. This implies that the ordinary wafers W, the number of which is equal to the sum of the temperature measurement wafers MW and the ordinary wafers W in the temperature measuring step, arranged on the same supporting levels as in the temperature measuring step. Particularly, in the heat treating step on the primary side, it is necessary to arrange and heat-treat wafers W on the support levels on which the temperature measurement wafers MW were arranged in the temperature measuring step.

Figure 4:
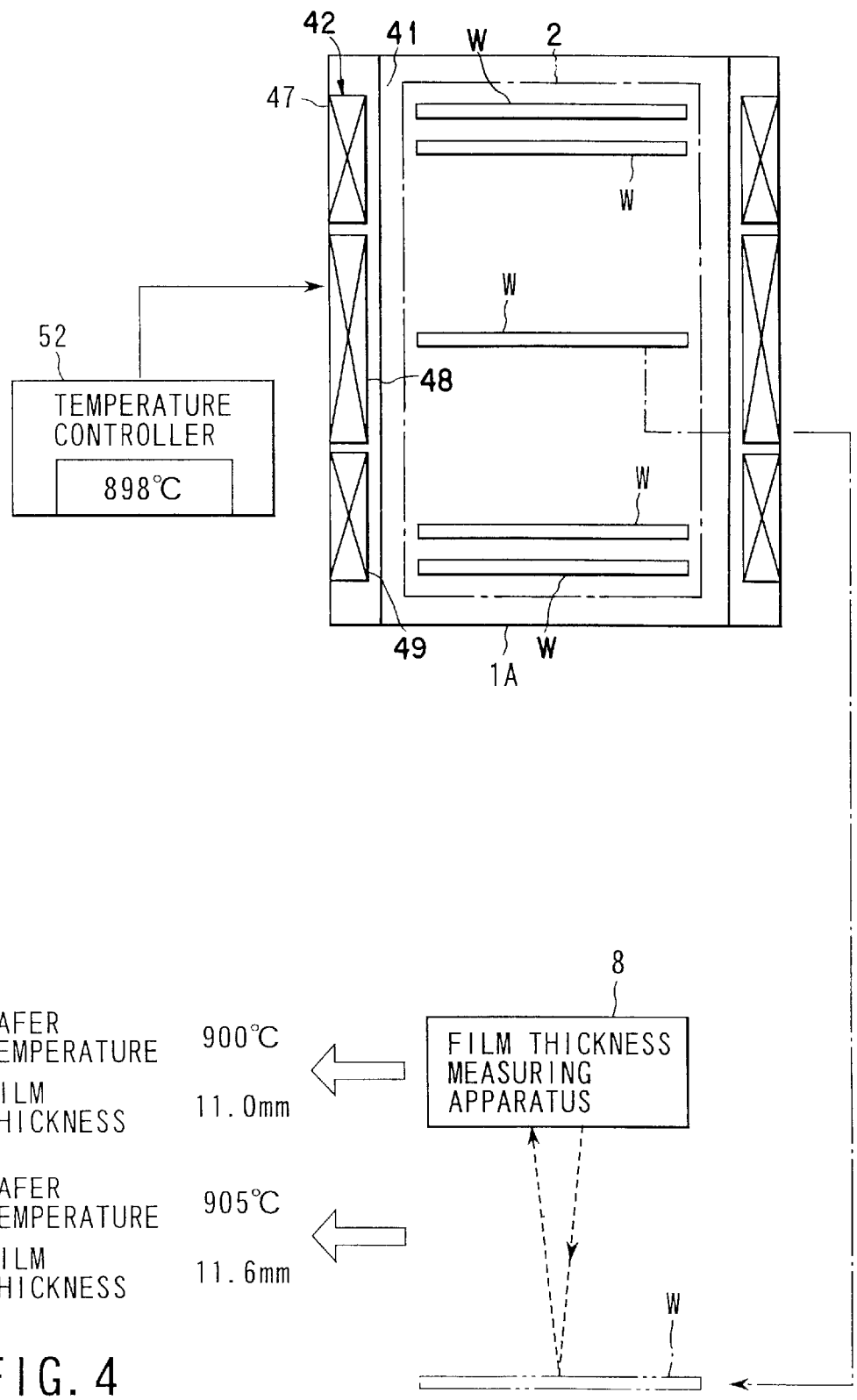
FIG. 4 is an explanatory view schematically showing the state that a thermal oxidizing process is applied to wafers W by setting the set values of temperature of the temperature controllers at certain values, and then the thickness of the oxide films formed on the wafers is measured.

The upper part of FIG. 4 schematically shows this situation. Only the temperature controller 52 corresponding to the middle heating zone is shown in FIG. 4. However, the set value of temperature for 900° C. is set similarly for each of the upper and lower temperature controllers 51 and 53.

Figure 5:
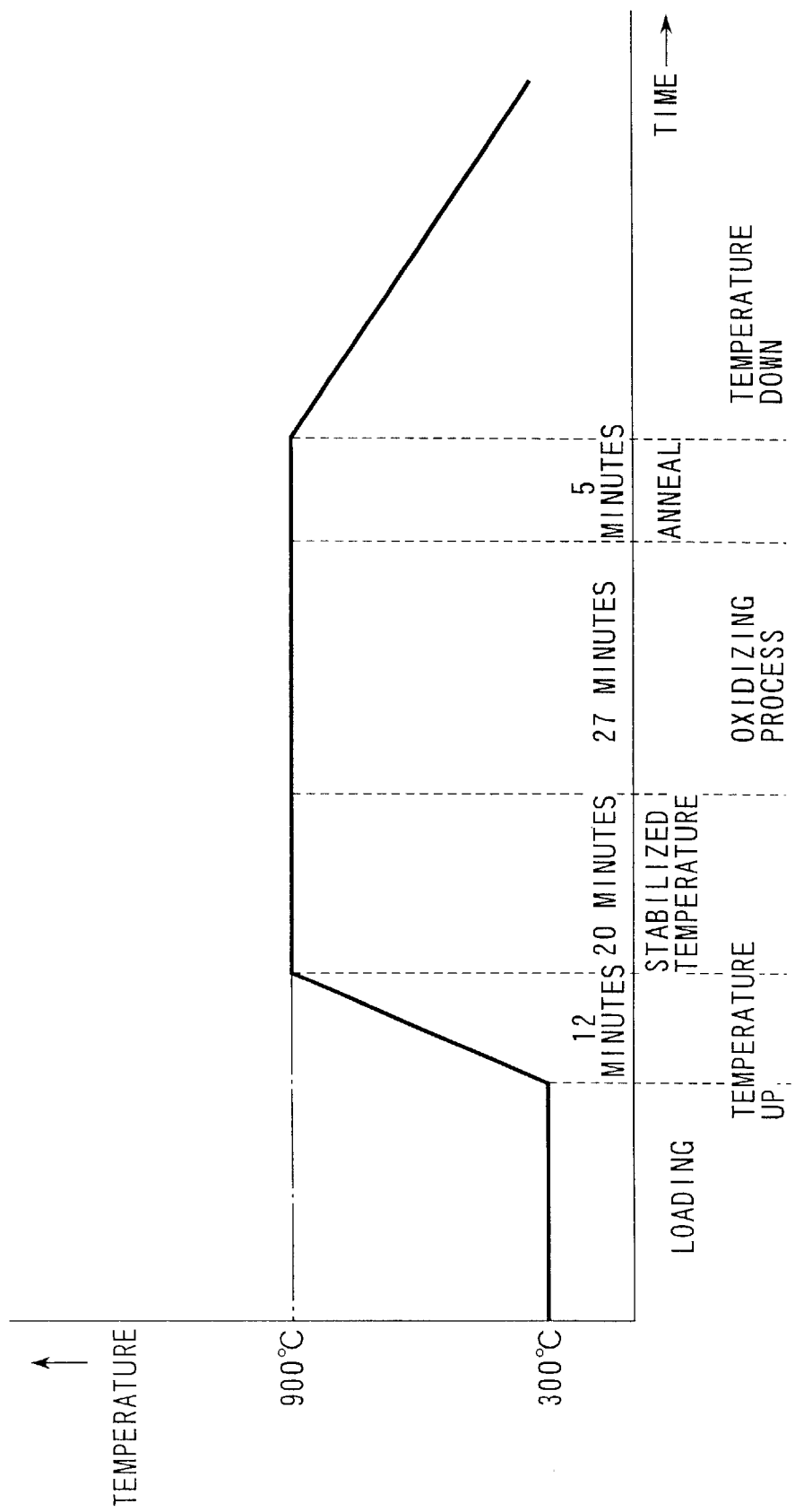
FIG. 5 is a temperature characteristic view showing an example of a recipe in respect of the wafer temperature.

FIG. 5 is an example of recipe relating to the temperature in the heating zones in the case of applying an oxidizing process to a target wafer W. For example, the wafer W is loaded at 300° C. into the heat treating furnace 1, and heated to the process temperature (900° C. in this example). After the temperature is stabilized, an oxygen gas, for example, is supplied into the heat treating furnace 1 so as to carry out the oxidizing process, followed by performing an annealing treatment. Then, the temperature is dropped. Note that the temperature controllers 51 to 53 are set at the set values of temperature for 900° C., so that the process temperature of the wafer W is aligned with 900° C. In this step, the process pressure and process gas conditions are selected such that the growth rate of the oxide film is changed as a function of temperature.

Then, the thickness of the oxide film formed on each wafer W after the oxidizing process is measured by a film thickness measuring apparatus 8, e.g., an ellipsometer, shown in a lower part of FIG. 4. The thickness of the oxide film thus measured is recorded as a reference film thickness at 900° C. obtained by the heat treating step on the primary side. Note that, this specific value of the film thickness is a value for the sake of convenience.

In the next step, the process temperature is slightly changed to, for example, 905° C., and the same oxidizing process is carried out by the same recipe, and then the thickness of the oxide film is measured. The term "same oxidizing process" implies that the recipe is the same in, e.g., the temperature in the loading step of the wafer W and the temperature rising rate, except the process temperature. Incidentally, if the set values of temperature of the temperature controllers 51 to 53 are obtained in advance in the above described temperature measuring step by using 905° C. as the target value of temperature other than 900° C., it is possible to obtain the process temperature of 905° C. accurately in the temperature measuring step. However, even if the set values of the temperatures for the temperature controllers 51 to 53 for 905° C. are not obtained in advance, it is possible to obtain the process temperature of 905° C. substantially accurately because the temperature difference from 900° C. is small.

In this manner, an adjustment data representing the amount of change in the reference film thickness and the amount of change in the process temperature is obtained on the basis of the thickness of the oxide film at 900° C. and the thickness of the oxide film at 905° C. In this embodiment, a film-thickness/temperature coefficient (amount of change in film thickness/amount of change in temperature) representing the amount of change in the film thickness caused by the change in process temperature by 1° C. is used as the adjustment data. For example, if the film thicknesses are 11.0 nm and 11.6 nm when the process temperatures are 900° C. and 905° C., respectively, the film-thickness/temperature coefficient is: (11.6−11.0)/(905−900)=0.12 nm/° C. Note that, FIG. 4 shows the wafer W in the heating zone of the middle heater 48 and the temperature controller 52 for the sake of convenience in explanation. Needless to say, however, the same procedures are taken with respect to the wafers W in the heating zones of the heaters 47 and 49. [Heat Treating Step on Secondary Side]

The temperature measuring step and the heat treating step on the primary side described above are performed on the side of, for example, a manufacturer of the vertical heat treating apparatus. On the other hand, the user of the vertical heat treating apparatus performs the temperature calibration as follows, upon receipt of information on, e.g., the reference film thickness at a process temperature of 900° C., the processing recipe and the film-thickness/temperature coefficient from the manufacturer.

Figure 6:
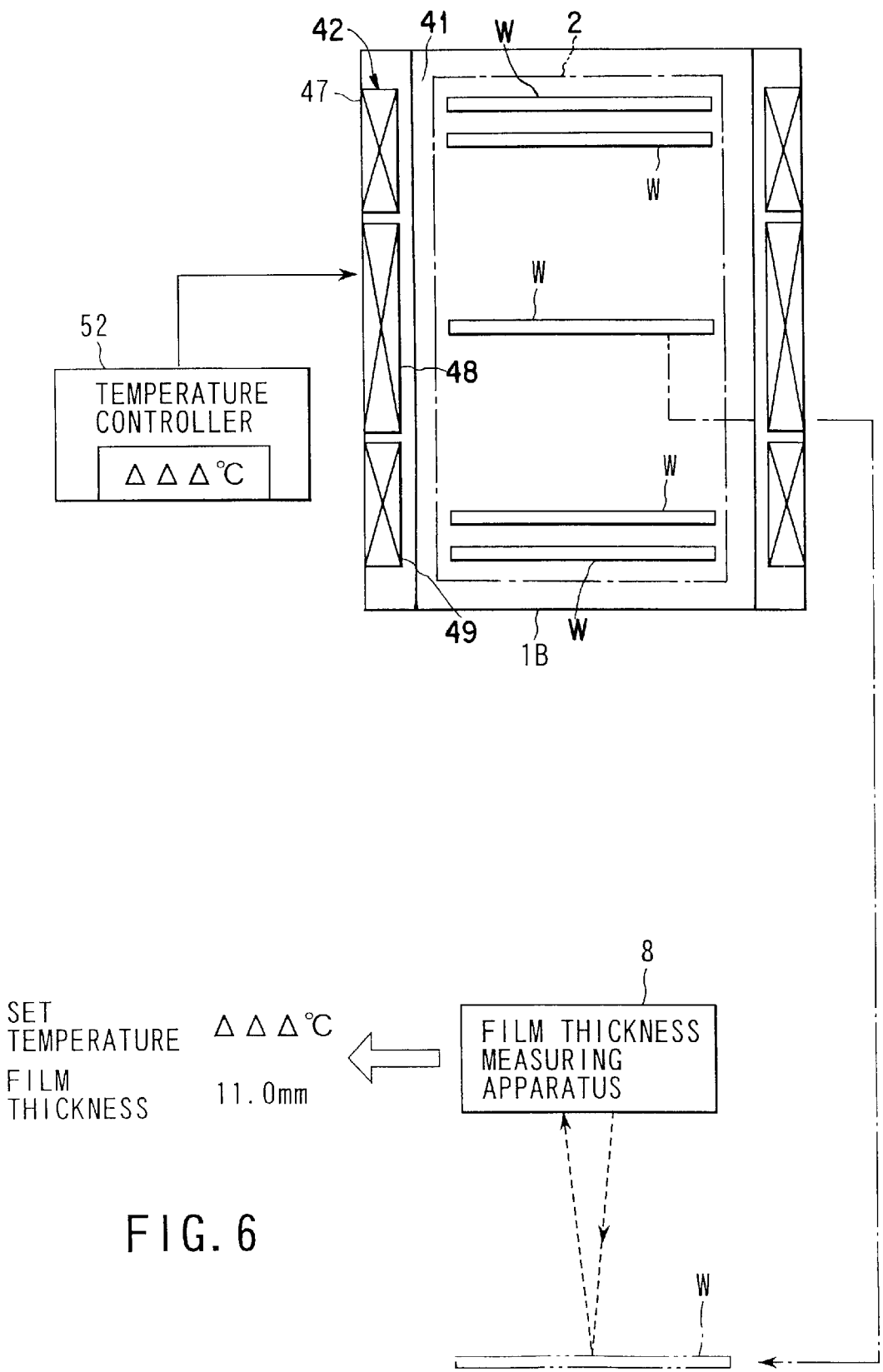
FIG. 6 is an explanatory view schematically showing the state that the thickness of an oxide films formed on wafers is measured, and then the set values of temperature of the temperature controllers are adjusted on the basis of the measured result.

Specifically, as shown in FIG. 6, an installed apparatus 1B on the side of the user is used as the second vertical heat treatment apparatus to be temperature-calibrated. In the first step, the wafer boat 2 supporting the ordinary wafers W for the heat treatment in the same manner as in the heat treating step on the primary side is loaded in the process chamber 41 of the installed apparatus 1B. Then, an oxidizing process is performed by setting the temperature controllers 51 to 53 at temporary set values of temperature for 900° C. so as to form an oxide thin film on each wafer W. Note that, in the heat treating step on the secondary side, it is necessary to arrange and heat-treat wafers W on the support levels on which the wafers W were supported in the heat treating step on the primary side for measuring the thickness of the oxide film.

In FIG. 6, only the temperature controller 52 corresponding to the middle heating zone is shown. However, the following operation is also performed for each of the upper and lower temperature controllers 51 and 53.

In principle, the heat treating step on the secondary side is carried out under the same conditions as in the heat treating step on the primary side. To be more specific, in this oxidizing process, the temperature within each heating zone is raised, kept at the raised temperature, and dropped in accordance with the recipe shown in FIG. 5. Also, the process pressure and process gas conditions are set equal to those selected in the heat treating step on the primary side.

Then, the thickness of the oxide film formed on each wafer W after the oxidizing process is measured by the film thickness measuring apparatus 8. For example, where the set value of temperature of the temperature controller 52 is set at 898° C., the process temperature of the wafer W becomes 900° C., if the temperature controller 52 is exactly equal to that of the reference apparatus 1A on the side of the manufacturer. However, since the reference apparatus 1A and the installed apparatus 1B individually differ from each other even where they have the same design, the process temperature fails to become 900° C. and, thus, the thickness of the oxide film fails to become 11.0 nm.

Under the circumstances, the difference is obtained between the film thickness measured in the heat treating step on the secondary side and the reference film thickness obtained in the heat treating step on the primary side. If the process temperature of the wafer W is 900° C., the difference is zero, and if not 900° C., the difference is not zero and assumes a certain value (difference in film thickness). On the other hand, since the film-thickness/temperature coefficient for this oxide film has already been obtained, it is possible to know the difference (° C.) of the process temperature from 900° C. in the above described heat treating step on the secondary side, on the basis of the difference in the film thickness and the film-thickness/temperature coefficient.

Then, the set value of temperature for the temperature controller 52 is adjusted to make up for the deviation of the temperature so as to set the corresponding heating zone at 900° C. Likewise, the set values of temperature for the temperature controllers 51 and 53 are adjusted to make up the deviation of the temperature. Then, the wafer boat 2 supporting new wafers W is loaded in the process chamber 41 of the installed apparatus 1B so as to carry out the heating treating step on the secondary side again.

To be more specific, the required adjusting amount of the set value of temperature is obtained on the basis of the formula as follows: temperature difference (amount of change in temperature)=[difference in film thickness (amount of change in film thickness)]/[film-thickness/temperature coefficient]. For example, if the film thickness obtained in the heat treating step on the secondary side is larger than the reference film thickness obtained in the heat treating step on the primary side by 0.24 nm, i.e., the film thickness difference is 0.24 nm, the temperature difference is: 0.24 (nm)/0.12 (nm/° C)=2° C. In this case, since the heat treatment in the heat treating step on the secondary side is supposed to have been conducted at 902° C., the treatment is carried out in the next heat treating step on the secondary side with the set value of temperature for the temperature controller set lower by 2° C.

As described above, the heat treating step on the secondary side is repeatedly carried out until the film thickness obtained in the heat treating step on the secondary side becomes equal to the reference film thickness obtained in the heat treating step on the primary side. When the film thickness obtained in the heat treating step on the secondary side becomes equal to the reference film thickness, the set values of temperature at the time for the respective temperature controllers 51 to 53 are obtained and recorded as the set values of temperature on the secondary side. In other words, these set values of temperature on the secondary side correspond to 900° C., which is the target value of temperature set in the reference apparatus 1A.

It follows that the apparatus 1B is temperature-calibrated on the assumption that the target value of temperature, which is 900° C., is obtained in each of the upper, middle and lower heating zones within the process chamber 41 when the set value of temperature for each of the temperature controllers 51 to 53 is rendered equal to the set value of temperature on the secondary side. As described above, the relationship between the actual temperatures of the heating zones and the set values of temperature of the temperature controllers 51 to 53 is recorded, and the wafer temperature can be controlled accurately by performing the heating treatment on the basis of the relationship thus recorded.

According to the embodiment described above, the temperature of the temperature measurement wafer MW within the reference apparatus 1A is detected in advance by the temperature measuring element 12 such as a thermocouple, and then a thermal oxidizing process, which is a heat treatment, is applied to the wafer W, and the thickness of the oxide film is detected. Then, the same process is carried out within the installed apparatus 1B to be temperature-calibrated, and then using the thickness of the oxide film as a medium, the temperature control unit 5 is temperature-calibrated. Therefore, it is unnecessary to put the temperature measuring element 12 in the installed apparatus 1B to be temperature-calibrated, thereby making it possible to avoid the contamination of the wafer W to be processed later within the installed apparatus 1B, with a metal generated from the temperature measuring element 12 such as a thermocouple.

In the embodiment described above, the values of the temperature controllers 51 to 53 with respect to 900° C., indicated on the temperature displays 71 to 73 in the temperature measuring step, are used as they are for carrying out the oxidizing process in the heat treating step on the primary side. However, it is possible to adjust the set values of the temperature controllers 51 to 53 by several degrees of centigrade, e.g., to set lower by 5° C., in the heat treating step on the primary side for carrying out the oxidizing process, thereby obtaining the reference film thickness at 895° C. In this case, the installed apparatus 1B is temperature-calibrated with the target value of temperature set at 895° C. via the thickness of the oxide film. In this manner, the case where a provisional target value of temperature used in the temperature measuring step differs from a latent actual target value temperature is also included in the technical scope of the present invention.

Also, in the embodiment described above, two process temperatures of 900° C. and 905° C. are set, and the film-thickness/temperature coefficient is actually obtained. However, it is possible to use the film-thickness/temperature coefficient, which is obtained by experiments in advance.

The growth rate of a film thickness is represented by formula (1) given below, and formula (2) given below can be obtained by partially differentiating formula (1) with respect to temperature T:

$$V = A \cdot \exp(-E/KT) \tag{1}$$

$$\{\partial V/\partial T\}/V = (E/K \cdot T2) * 100 [\%/^\circ C] \tag{2}$$

where V denotes the growing rate of the film thickness, K denotes the Boltzmann constant, T denotes absolute temperature, and E denotes activation energy.

Since formula (2) represents the film-thickness/temperature coefficient, the value of the film-thickness/temperature coefficient can be obtained by substituting in formula (2) the activation energy, the temperature, and the film thickness, which are obtained by experiments.

Where the film-thickness/temperature coefficient is used, it is possible to allow the set value of temperature for the temperature control unit 5 to be easily brought close to and onto the target value. However, it is also possible to repeat the processing without using the film-thickness/temperature coefficient such that the set value of temperature is adjusted to achieve a uniform film thickness by trial and error. Also, in the embodiment described above, a general model is described on the respective sides of the manufacturer and the user of the heat treating apparatus. However, it is possible for all the steps described above to be performed on the side of the user.

Further, the heat treatment is not limited to the oxidizing process. It is possible to apply the technical idea of the present invention to an arbitrary film forming process such as formation of a nitride film by using ammonia and dichlorosilane. Also, where the temperature of the temperature measurement wafer is measured in the temperature measuring step, it is possible to use a radiation thermometer or the like in place of the temperature measuring element 12 such as a thermocouple. Further, the method of the present invention for calibrating the temperature can be applied to not only batch type heat treating apparatuses but also to single-substrate type heat treating apparatuses in which wafers or the like is subjected to a heat treatment one by one.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of temperature-calibrating a second heat treating apparatus based on a heat treatment result obtained by a first heat treating apparatus for reference, the first heat treating apparatus comprising a first process chamber, a first heating unit for heating an inside of the first process chamber, and a first controller for setting a temperature of the first heating unit, the second heat treating apparatus comprising a second process chamber, a second heating unit for heating an inside of the second process chamber, and a second controller for setting a temperature of the second heating unit, the first and second process chambers being substantially equal to each other in construction and the first and second heating units being substantially equal to each other in construction, the method comprising:

a temperature measuring step of heating a measurement substrate for measuring temperature at a selected position within the first process chamber by the first heating unit, and obtaining a first set value of temperature of the first controller for converging a measured temperature of the measurement substrate to a target value of temperature;

a heat treating step on a primary side of forming a first thin film on a first substrate by heating the first substrate at the selected position within the first process chamber by the first heating unit while setting the first controller at the first set value of temperature, the first thin film being formed under a selected process pressure and selected process gas conditions that are selected such that a growth rate of the first thin film is changed as a function of temperature;

a heat treating step on a secondary side of forming a second thin film equal in material to the first thin film on a second substrate substantially equal in size and material to the first substrate under the selected process pressure and selected process gas conditions by heating the second substrate at a position, corresponding to the selected position, within the second process chamber by the second heating unit; and a calibrating step of obtaining a second set value of temperature of the second controller at the time when a thickness of the first thin film and a thickness of the second thin film are made equal to each other, and temperature-calibrating the second heat treating apparatus based on an assumption that the target value of temperature is obtained at the position, corresponding to the selected position, within the second process chamber at a time when a set temperature of the second controller is the second set value of temperature.

2. The method according to claim 1, wherein the heat treating step on the secondary side is performed a plurality of times respectively to a plurality of second substrates to obtain the second set value of temperature, in which the second controller is set at different set values of temperature among the plural second substrates.

3. The method according to claim 2, wherein, when the second heat treating step is performed the plurality of times respectively to the plurality of second substrates, the second controller is set at the different set values of temperature based on adjustment data representing a relationship between an amount of change in a thickness of the first thin film and an amount of change in temperature in forming the first thin film.

4. The method according to claim 3, wherein the adjustment data includes a film-thickness/temperature coefficient.

5. The method according to claim 3, wherein the adjustment data is formed by setting a plurality of target values of temperature as the target value of temperature, and each of the temperature measuring step and the heat treating step on the primary side are carried out for each of the plurality of target values of temperature.

6. The method according to claim 3, wherein the adjustment data is formed by applying a heat treating step equivalent to the heat treating step on the primary side to another first substrate, except that the first controller is set at a set value of temperature deviant from the first set value of temperature.

7. The method according to claim 3, wherein the adjustment data is formed by experiments prior to the temperature measuring step.

8. The method according to claim 1, wherein the measurement substrate includes a temperature measuring element mounted thereon.

9. The method according to claim 1, wherein the first and second substrates are substantially equal in size and material to a substrate to be subjected to a heat treatment in the second heat treating apparatus.

10. The method according to claim 1, wherein the measurement substrate comprises a substrate substantially equal in size and material to the first and second substrates.

11. A method of temperature-calibrating a second vertical heat treating apparatus based on a heat treatment result obtained by a first vertical heat treating apparatus for reference, the second vertical heat treating apparatus being configured to apply a heat treatment to a plurality of target substrates, which are substantially equal to each other in the contour size, altogether, the first heat treating apparatus comprising a first process chamber, a first heating unit having a plurality of first heaters arranged to heat zones differing from each other in height level inside the first process chamber, and a plurality of first controllers for setting temperatures of the first heaters, the second heat treating apparatus comprising a second process chamber, a second heating unit having a plurality of second heaters arranged to heat zones differing from each other in height level inside the second process chamber, and a plurality of second controllers for setting temperatures of the second heaters, the first and second process chambers being substantially equal to each other in construction and the first and second heating units being substantially equal to each other in construction, the method comprising:

a temperature measuring step of heating a plurality of measurement substrates for measuring temperature at selected positions within the zones of the first process chamber by the first heaters, and obtaining a first set value of temperature of each first controller for converging a measured temperature of each measurement substrate to a target value of temperature;

a heat treating step on a primary side of forming a first thin film on each of a plurality of first substrates by heating the first substrates at the respective selected positions within the first process chamber by the first heaters while setting each of the first controllers at the first set value of temperature, the first thin film being formed under a selected process pressure and selected process gas conditions that are selected such that a growth rate of the first thin film is changed as a function of temperature;

a heat treating step on a secondary side of forming a second thin film equal in material to the first thin film on each of a plurality of second substrates substantially equal in size and material to the first substrates under the selected process pressure and selected process gas conditions by heating the second substrates at positions, corresponding to the selected positions, within the second process chamber by the second heaters; and a calibrating step of obtaining a second set value of temperature of each of the second controllers at the time when a thickness of the first thin film and a thickness of the second thin film are made equal to each other, and temperature-calibrating the second heat treating apparatus based on an assumption that the target value of temperature is obtained at the positions, corresponding to the selected positions, within the second process chamber at a time when a set temperature of each of the second controllers is the second set value of temperature.

12. The method according to claim 11, wherein the heat treating step on the secondary side is performed a plurality of times respectively to a plurality of groups of second substrates to obtain the second set value of temperature, in which the second controller is set at different set values of temperature among the plurality of groups.

13. The method according to claim 12, wherein, when the second heat treating step is applied to the plurality of groups, each of the second controllers is set at the different set values of temperature based on adjustment data representing a relationship between an amount of change in a thickness of the first thin film and an amount of change in temperature in forming the first thin film.

14. The method according to claim 13, wherein the adjustment data includes a film-thickness/temperature coefficient.

15. The method according to claim 13, wherein the adjustment data is formed by setting a plurality of target values of temperature as the target value of temperature, and each of the temperature measuring step and the heat treating step on the primary side are carried out for each of the plurality of target values of temperature.

16. The method according to claim 13, wherein the adjustment data is formed by applying a heat treating step equivalent to the heat treating step on the primary side to another plurality of first substrates, except that each of the first controllers is set at a set value of temperature deviant from the first set value of temperature.

17. The method according to claim 13, wherein the adjustment data is formed by experiments prior to the temperature measuring step.

18. The method according to claim 11, wherein each of the measurement substrates includes a temperature measuring element mounted thereon.

19. The method according to claim 11, wherein the first and second substrates are substantially equal in size and material to the target substrates.

20. The method according to claim 11, wherein each of the measurement substrates comprises a substrate substantially equal in size and material to the first and second substrates.

* * * * *